(12) United States Patent
Arndt et al.

(10) Patent No.: US 7,550,827 B2
(45) Date of Patent: Jun. 23, 2009

(54) CONDUCTOR FRAME FOR AN ELECTRONIC COMPONENT AND METHOD FOR THE PRODUCTION THEREOF

(75) Inventors: Karlheinz Arndt, Bad Abbach (DE); Huey Ling Rena Lim, Regensburg (DE); Georg Bogner, Lappersdorf (DE); Stefan Gruber, Bad Abbach (DE); Markus Schneider, Schönhofen (DE)

(73) Assignee: Osram Opto Semiconductor GmbH (DE)

( * ) Notice: Subject to any disclaimer, the term of this patent is extended or adjusted under 35 U.S.C. 154(b) by 0 days.

(21) Appl. No.: 11/576,054

(22) PCT Filed: Aug. 8, 2005

(86) PCT No.: PCT/DE2005/001402

§ 371 (c)(1),
(2), (4) Date: Jan. 31, 2008

(87) PCT Pub. No.: WO2006/034664

PCT Pub. Date: Apr. 6, 2006

(65) Prior Publication Data

US 2008/0251900 A1 Oct. 16, 2008

(30) Foreign Application Priority Data

Sep. 28, 2004 (DE) ................ 10 2004 047 059

(51) Int. Cl.
*H01L 23/495* (2006.01)
*H01L 33/00* (2006.01)

(52) U.S. Cl. .......... 257/670; 257/666; 257/673; 257/676; 257/E33.066; 257/E23.031

(58) Field of Classification Search .......... 257/666, 257/670, 673, 676, E33.066, E23.05
See application file for complete search history.

(56) References Cited

U.S. PATENT DOCUMENTS

RE37,707 E * 5/2002 Bozzini et al. .......... 257/675

FOREIGN PATENT DOCUMENTS

| DE | 69113079 | 5/1996 |
|----|----------|--------|
| EP | 0496078 | 7/1992 |
| JP | 61279161 | 12/1986 |
| JP | 01175250 | 7/1989 |

OTHER PUBLICATIONS

Authorized officer: Kuchenbecker, J., International Search Report, PCT/DE2005/001402, Feb. 9, 2006.

\* cited by examiner

*Primary Examiner*—Victor A Mandala
(74) *Attorney, Agent, or Firm*—Fish & Richardson P.C.

(57) ABSTRACT

Disclosed is a leadframe lot at least one electronic component, composing at least two electrical lead elements, each of which comprises at least one electrical lead tab and at least one retention tab. Provided between the at least one retention tab and the lead element is a score defining parallel offset between the retention tab and the adjacent region of the lead element. An additional parallel offset is defined between the lead element and the electrical lead tab, such that the retention tab and the electrical lead tab are located in a common plane. The score enables the retention tab to be removed easily without the need for a disadvantageous punched gap between the lead element and the retention tab.

14 Claims, 3 Drawing Sheets

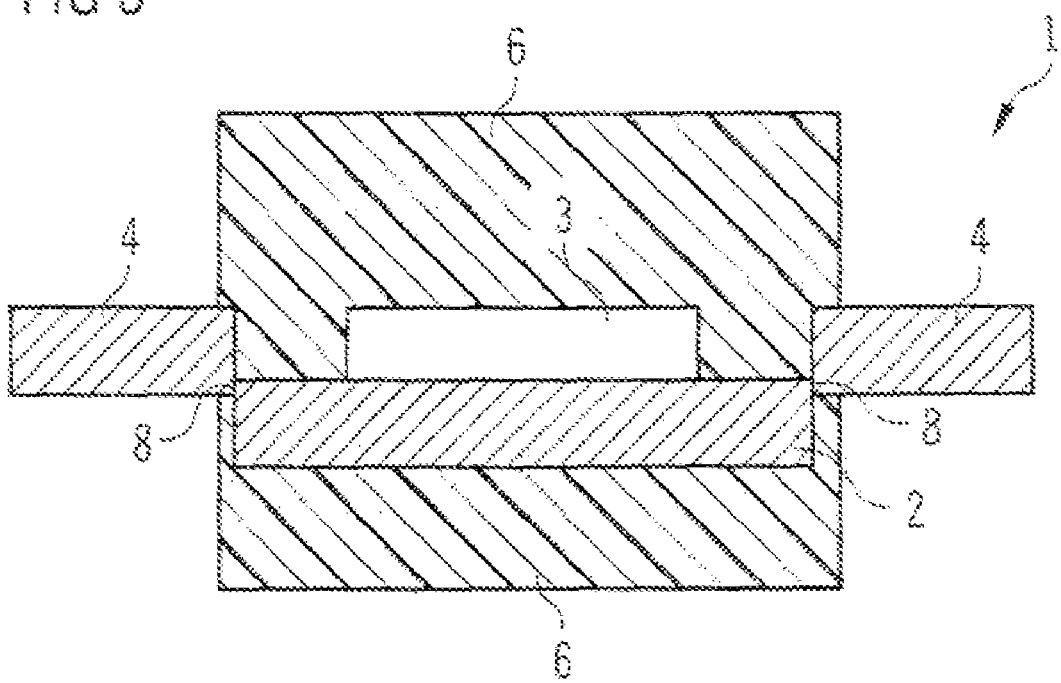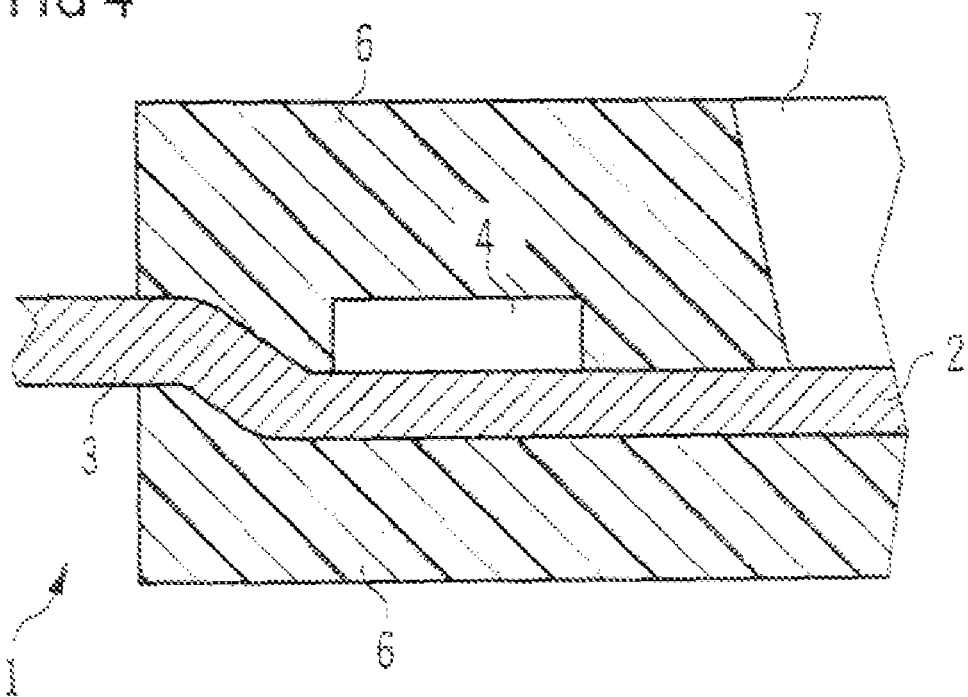

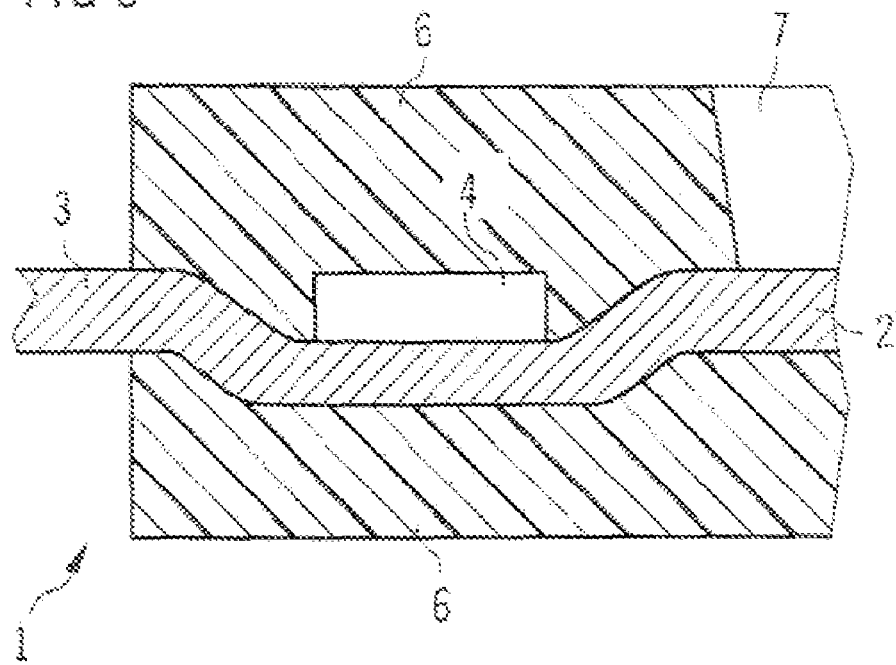
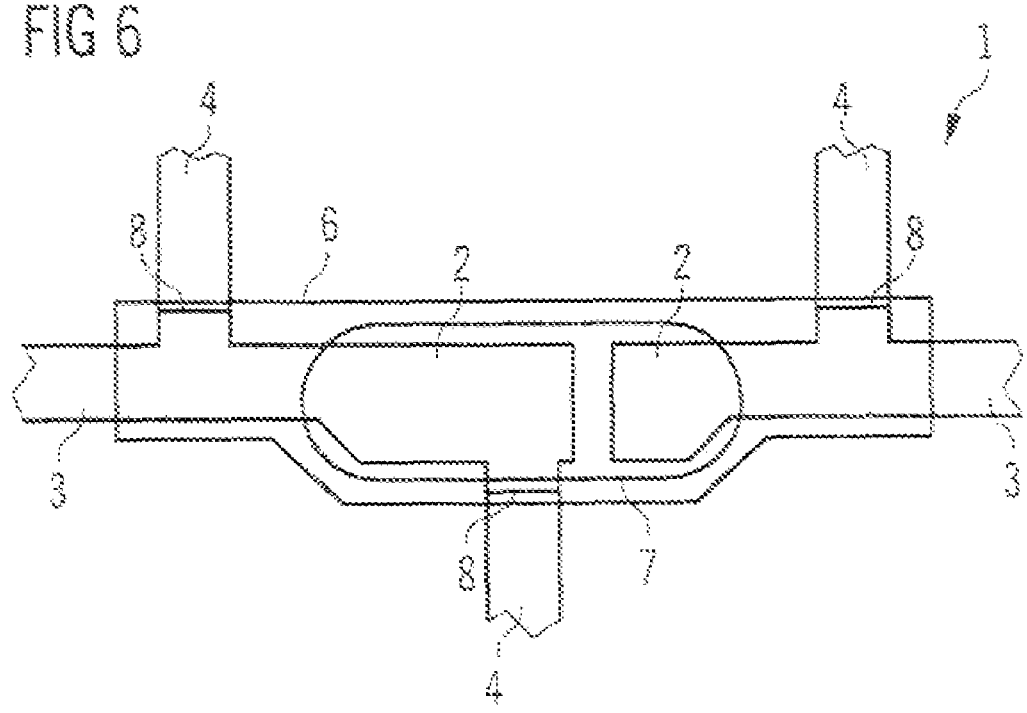

CONDUCTOR FRAME FOR AN ELECTRONIC COMPONENT AND METHOD FOR THE PRODUCTION THEREOF

CROSS-REFERENCE TO RELATED APPLICATIONS

This application is the National Stage of International Application No. PCT/DE2005/001402, filed on Aug. 8, 2005, which claims the priority to German Patent Application Serial No. 10 2004 047 059.6 filed on Sep. 23, 2004. The contents of both applications are hereby incorporated by reference in their entireties.

FIELD OF THE INVENTION

The invention relates to a leadframe for at least one electronic component and a method for manufacturing the same.

BACKGROUND OF THE INVENTION

The term "leadframe" denotes an array of metallic lead elements for a semiconductor component; such arrays are stamped or etched out of sheet metal and are used during the manufacturing process. Initially, the individual lead elements remain interconnected in an outer region of the leadframe and are thereby held in position relative to one another. One or more semiconductor chips are then disposed on designated lead elements of the leadframe and are contacted with other lead elements via so-called bonding wires. Only after the semiconductor chips and parts of the leadframe have been enveloped in a housing made of a compression- or injection-molded plastic compound is the component, with its lead tabs, separated from the leadframe in a desired length. In addition to the lead elements, leadframes often further comprise retention tabs, which are also overmolded by the housing and serve to fix the component in retaining devices during the manufacturing process. If the retention tabs are inserted in the housing to only a very shallow depth, they can easily be pulled out of the housing at the end of the manufacturing process. Failing this, it is possible, but more onerous, to sever the retention tabs close to the housing. To be able to implement the retaining devices as simply as possible, it is desirable for the portions of the lead elements that protrude from, the housing—which portions will be referred to hereinafter as lead tabs—and the retention tabs to lie in one plane. In addition, in order to simplify and automate the process of manufacturing semiconductor components, leadframes usually are not fabricated for a single component, but are provided in the form of endless strips for a large number of identical components. It is also known to mold portions of the housing onto the leadframe even before the semiconductor chip is mounted on it.

The concept of retention tabs can be especially problematic where very small housing dimensions are concerned. One example of a type of component that is provided with such a housing is surface-mounted, light-emitting semiconductor components (LEDs or light-emitting diodes). The housings of such components are typically oblong and have two lead tabs that protrude—axially, if possible—from the housing, which is only negligibly wider than the lead tabs. For the retention tabs to be such that they can be removed merely by pulling them out of the housing, they must already be separated from other lead elements in the region of the housing. In the prior art, this inevitably entails a punched or etched gap between the ends of the respective retention tabs and the adjacent regions of the lead elements.

FIG. 1 exemplarily illustrates this problem associated with leadframes according to the prior art.

FIG. 1 illustrates the central, inner portion of a metallic leadframe 1 according to the prior art in a schematic sectional diagram. The leadframe 1 comprises two electrical lead elements 2, whose outer portions are denominated as lead tabs 3. Further provided are four retention tabs 4, which are separated from the lead elements 2 by punched or etched gaps 5. Further provided is a housing body 6, which is molded onto the leadframe 1. The housing body 6 has a central recess 7, in which for example an LED chip can be disposed when the component is intended to be radiation-emitting.

The arrangement illustrated schematically in FIG. 1 is typical of a surface-mountable light-emitting semiconductor component, such as for example a miniature LED. In the example shown, the housing body 6, made for example of plastic, is already molded onto the leadframe 1. The leadframe 1 can be made for example of copper, possibly coated with another metal. During the subsequent manufacturing process of the component, a semiconductor chip is placed through the recess 7 onto one of the electrical lead elements 2 and is connected to the other electrical lead element 2 via a bonding wire. The opening 7 is then filled with light-transparent synthetic resin. This so-called premold technology, in which parts of the housing are molded onto a leadframe prior to the insertion of the semiconductor chip, is familiar to the specialist in optoelectronic components and thus will not be described further herein.

The electrical lead tabs 3 protrude axially from the oblong housing body 6. As the component manufacturing process continues, these lead tabs 3 are cut to a set length and bent. Such manufacturing processes, known as trim and form, require that the component be fixed in a retaining device. This purpose is served by the retention tabs 4. They extend just far enough into the housing body 6 so that they are able to transmit the necessary retention forces to the component when clamped in the retaining device and still can be removed from the housing body 6 by the application of slight pulling forces when no longer needed. Typical depths for which the retention tabs 4 extend into the housing body for this purpose are in the range of 5/100 mm. To be removable by the exertion of slight pulling forces, the retention tabs 4 must be separated adequately from the lead elements 2 in the leadframe 1.

According to the prior art, the separation of the retention tabs from the component is effected by means of a punching or etching process that results in a punched or etched gap 5. Given the prescribed dimensions of the housing body 6, this gap 5 requires that the lead elements 2 be tapered in the region of the retention tabs 4. This taper has the effect of making the leadframe 1 mechanically unstable, which can have adverse effects particularly during the steps of the manufacturing process in which no part of the housing body 6 has yet been molded onto the leadframe 1. Another consequence of tapering the lead elements 2 is that heat generated by the semiconductor chip during the operation of the component cannot be dissipated adequately via the lead tabs 3.

SUMMARY OF THE INVENTION

It is, therefore, the object of the present invention to disclose a leadframe that makes retention tabs available even for very small housings and does not have the recited disadvantages. At the same time, the relative arrangement of the retention tabs and the lead tabs is intended to permit easy technical configuration of the retaining devices used during the manufacturing process.

According to the invention, provided between a retention tab and the adjacent region of the lead element is a score, by means of which a parallel offset is created between the retention tab and the lead element. Such a score enables the retention tab subsequently to be removed from the housing of the component by the application of slight pulling forces. An advantage of a score over a punched or etched gap is that a score can be fashioned without removing any material and thus without taking up additional space, thus eliminating the need for disadvantageous tapering of the lead elements to accommodate the retention tabs. The parallel offset between the retention tab and the lead element that is introduced by the score is compensated for according to the invention by means of an additional parallel offset between the lead tab and the regions of the lead element adjacent the retention tab, so that the retention tab and the lead tab are again located in one plane. This ensures ease of configuration of the retaining devices and injection molds used in the manufacturing process.

In an advantageous embodiment of the leadframe, the electrical lead tabs are configured such that they protrude, on two mutually opposite side faces, from a housing body that is provided for the component and is to be molded onto the leadframe at a subsequent point in time. It is particularly favorable if the at least one retention tab is then configured to protrude outward through a third side face of the provided housing body.

The depth of the score can be less than the thickness of the leadframe or it can be equal to the thickness of the leadframe. In the first-cited case, the severance at the site of the score is performed for example in a subsequent step of the manufacturing process.

It is preferable, in a first alternative, to provide for each lead tab at least two retention tabs, which are disposed on mutually opposite sides of the provided housing body and, in a particularly favorable embodiment, are located exactly opposite each other. As a second alternative, at least two retention tabs disposed on mutually opposite sides of the provided housing body are provided for the electronic component.

In one advantageous embodiment, a large number of such leadframes are continuously configured in the form of an endless strip and are intended for the mechanical and automated mass production of a large number of electronic components. The additional parallel offset according to the invention between the electrical lead tabs and the region of the lead element adjacent the retention tab has proven to be especially advantageous for this embodiment. If the retention tabs and the electrical lead tabs did not lie in one plane, the mechanical stress that would be introduced into the leadframe as a result, particularly a leadframe fashioned as an endless strip, would lead to rejects.

In a further embodiment, a housing body or parts of a housing body are molded onto the leadframe, typically in an injection molding process. This is known as a premolded leadframe.

A preferred method for manufacturing a leadframe according to the invention is characterized in that the electrical lead tabs are offset in parallel relative to the region of the lead element adjacent the retention tab by means of a stamping process. It is preferred for the scoring and the additional parallel offsetting to be performed simultaneously in a combined cold forming process.

Further advantages, preferred embodiments and improvements of the leadframe and of the method will emerge from the following exemplary embodiments, which are explained in further detail in conjunction with the figures.

BRIEF DESCRIPTION OF THE DRAWINGS

FIG. 3 is a sectional view through an exemplary embodiment of the inventive leadframe according to FIG. 2, taken along line AA, FIG. 4 is a schematic sectional view through an exemplary embodiment of the inventive leadframe according to FIG. 2, taken along line BB, FIG. 5 is a schematic sectional view through a further exemplary embodiment of the inventive leadframe according to FIG. 2, taken along line BB, and FIG. 6 is a schematic sectional diagram of a further exemplary embodiment of the inventive leadframe.

Figure 1:
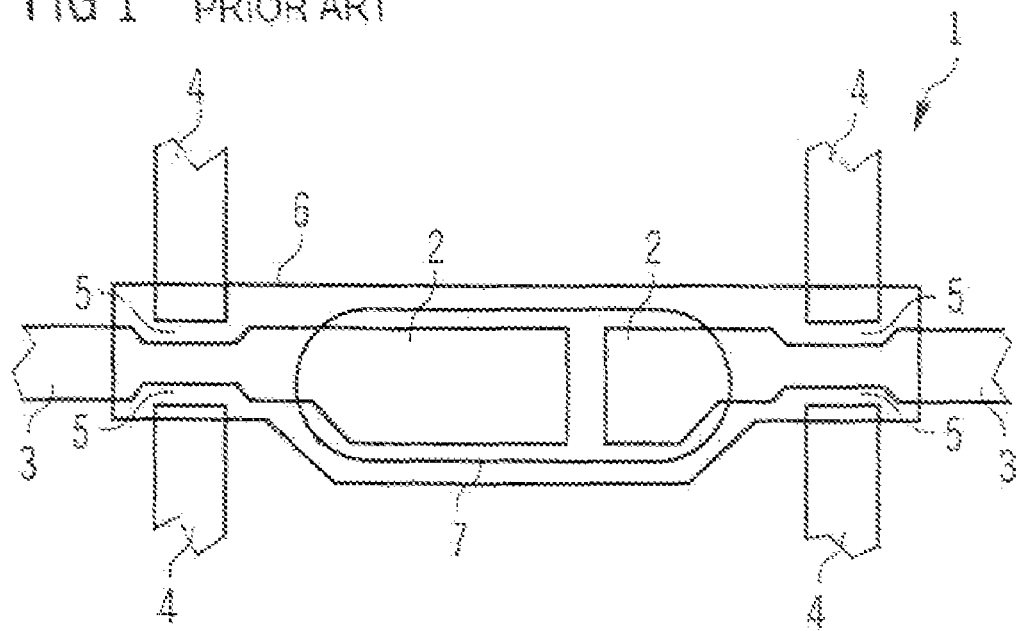
FIG. 1 is a schematic sectional diagram of a leadframe with retention tabs according to the prior art.
Figure 2:
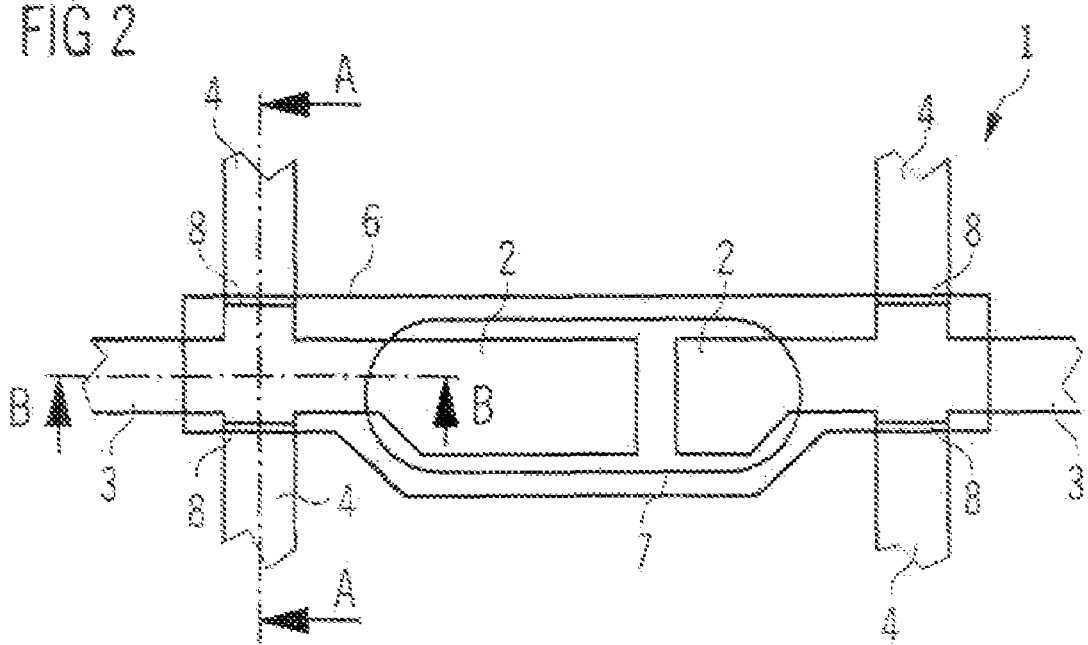
FIG. 2 is a schematic sectional diagram of an exemplary embodiment of a leadframe according to the invention.

In the various exemplary embodiments and the related FIGS. 2 to 4, and in FIG. 1 descriptive of the prior art, like or like-acting elements are provided with the same respective reference numerals. The depicted elements in the figures are basically not to be considered true to scale. Rather, for the sake of better understanding, they may be depicted in part as exaggeratedly large and in size relationships that do not accord with reality.

DETAILED DESCRIPTION OF THE PREFERRED EMBODIMENTS

FIG. 1, which shows the central, inner portion of a metallic leadframe 1 according to the prior art, was described in detail previously hereinabove.

An exemplary embodiment of a leadframe 1 according to the invention is illustrated in FIG. 2, in a representation analogous to that of FIG. 1. The fact that a leadframe 1 prepared via premold technology is depicted is merely exemplary and is not essential to the invention.

The leadframe illustrated in FIG. 2 differs from the leadframe according to the prior art in that instead of the stamped or etched gaps 5 between the retention tabs 4 and the lead elements 2, at least one score is provided in each case. These scores 8 are fashioned such that they remove substantially no material from the leadframe 1. Thus, no spacing is introduced between the lead elements 2 and the retention tabs 4 in the plane of the leadframe 1. There is no stamped or etched gap 5 of the kind that appears in prior-art leadframes, and tapering of the lead element 2 is eliminated.

As a result of the score, the retention tabs 4 are completely or partially separated from the lead elements 2 by a parallel offset in the plane perpendicular to the leadframe 1, by which means they can be removed from the housing 6 by means of slight pulling forces in the event that they are no longer needed. Such a score 8 can easily be produced in a punching process by means of two edges of the punch that move toward each other and have no space between them in the plane of the leadframe 1, and which shear the retention tabs 4 off the lead elements 2. The scores 8 can simultaneously be fashioned in terms of depth such that the retention tabs 4 are still connected to the lead elements 2, but can easily be detached after the application of pulling forces. However, the scores 8 can just as well be fashioned as so deep that the retention tabs 4 are already completely detached from the lead elements 2.

Without additional measures, the parallel offset between the retention tabs 4 and the lead elements 2 occasioned by the scores 8 would make it so that the lead tabs 3 and the retention tabs 4 no longer lay in one plane. A leadframe with characteristics of this kind poses difficulties for the subsequent manufacturing process. If the retention tabs 4 and the lead tabs 3 do not lie in one plane, all the retaining devices used in the course of the manufacturing process are complicated unnecessarily. The injection molds used for molding-on the housing body also demand more labor and expense. Conversely, if the retention tabs 4 and the lead tabs 3 are pressed back into one plane at the cutting line, high internal tensions occur in the leadframe, since the leadframe is expanded laterally slightly at the cutting lines. These internal tensions lead to rejections of the leadframe, particularly when it is implemented as an endless strip suitable for receiving a large number of identical components.

For this reason, it is provided, according to the invention to compensate for each parallel offset caused by the scores 8 via a respective additional parallel offset between the lead tabs 3 and the regions of the lead elements 2 directly adjacent the retention tabs 4.

FIG. 3 shows a sectional view of the inventive leadframe 1 with the molded-on housing body 6, taken along section line AA indicated in FIG. 2. Clearly visible in the figure is the parallel offset, created by the scores 8, between the retention tabs 4 protruding laterally from the housing body 6 and the adjacent regions of the lead elements 2. In the example shown, the scores are made to a depth that is slightly smaller than the thickness of the leadframe 1, thus not completely detaching the retention tabs 4 from the electrical lead elements 2. It can also be clearly distinguished that the lead tabs 3, extending forwardly from the plane of the image, also exhibit a parallel offset relative to the lead element 2, such that the lead tabs 3 and the retention tabs 4 lie in one plane.

FIGS. 4 and 5 show schematic sectional diagrams along line BB indicated in FIG. 2, for two different exemplary embodiment of the leadframe with molded-on housing body 6. Common to both exemplary embodiments is the fact that the retention tabs 4 lie in the same plane as the lead tab 3, shown on the left.

In the exemplary embodiment of FIG. 4, there is a parallel offset between lead tab 3 and the entire remainder of lead element 2. This has the result that the region of lead element 2 located inside the opening 7 and serving as the chip carrier also lies outside the original plane of the leadframe 1.

In the alternative embodiment of FIG. 5, by contrast, two stamping edges are provided, so that only the region of lead elements 2 directly adjacent retention tabs 4 lies outside the original plane of the leadframe 1. Both embodiments possess the advantages of the invention, but the embodiment of FIG. 4 is easier to implement in terms of tool and die engineering.

FIG. 6 shows a further exemplary embodiment of the inventive leadframe 1 with a molded-on housing body 6 in an illustration analogous to that of FIG. 2. Whereas in the exemplary embodiment depicted in FIG. 2, two symmetrically arranged and mutually opposite retention tabs 4 are provided for each lead tab 3, this exemplary embodiment has a total of only three retention tabs 4. As in the previous case, two of these retention tabs 4 are disposed in the immediate vicinity of the lead tabs 3, while the third retention tab 4 is centrally disposed on the opposite side of the housing 6. In addition to these two illustrated possible arrangements of the retention tabs 4, any desired other combinations may be contemplated and are within the purport of the invention. In general, it is advantageous for retention tabs 4 to be present on at least two opposite sides of the component. It is further advantageous if one of the two sides is provided with two retention tabs 4 that are spaced as far apart as possible. An arrangement of the retention tabs 4 that satisfies these criteria enables the component to be fixed more securely in a retaining device.

The description of the invention on the basis of the selected exemplary embodiments is not to be construed as limiting the invention thereto. Rather, the invention encompasses all the features recited in the description and/or the claims and any combination of said features, even if that combination is not explicitly the subject of a claim.

The invention claimed is:

1. A leadframe for at least one electronic component, comprising:
    at least two electrical lead elements, each comprising at least one electrical lead tab, and
    at least one retention tab adjacent a region of one of said electrical lead elements, wherein said retention tab and said electrical lead tabs are located in a common plane and wherein said region of said lead element adjacent said retention tab is offset from said common plane,
    wherein said at least one retention tab is at least partially sheared off said region of said lead element adjacent said retention tab providing a sheared interface defining a parallel offset between said retention tab and said adjacent region of said lead element, at which said region of said lead element adjacent said retention tab is offset from said common plane without lateral separation between said at least one retention tab and said adjacent region of said lead element.

2. The leadframe as in claim 1, wherein said electrical lead tabs protrude on two mutually opposite side faces from a housing body when said housing body is molded onto said leadframe at a subsequent point in time.

3. The leadframe as in claim 2, wherein at least one retention tab is configured such that it extends into said housing body through a third side face of said housing body.

4. The leadframe as in claim 1, wherein is said at least one retention tab is only partially sheared off said region of said lead element adjacent said retention tab.

5. The leadframe as in claim 1, wherein said at least one retention tab is completely sheared off said region of said lead element adjacent said retention tab.

6. The leadframe as in claim 1, wherein at least a portion of a housing body is molded onto said leadframe.

7. The leadframe as in claim 6, wherein at least two of said retention tabs are provided per lead tab and are disposed on mutually opposite sides of said housing body.

8. The leadframe as in claim 7, wherein the at least two of said retention tabs per lead tab are disposed opposite each other.

9. The leadframe as in claim 6, wherein at least two of said retention tabs are provided for said electronic component and are disposed on mutually opposite sides of said housing body.

10. A method for manufacturing a leadframe as in claim 1, including performing a cold forming process to cause said region of said lead element adjacent said retention tab to be offset from said common plane.

11. The method as in claim 10, wherein performing the cold forming process comprises:
    at least partially shearing said at least one retention tab off said region of said lead element adjacent said retention tab.

12. An array of leadframes comprising:
    a strip of two or more leadframes as in claim 1, each of the two or more leadframes being interconnected to another of the two or more leadframes, each of the two or more leadframes being configured to receive an associated electronic component.

13. The array of claim 12, wherein the strip is a continuous strip.

14. The leadframe as in claim 1, wherein the leadframe is configured to have a housing body molded onto the leadframe.

* * * * *

UNITED STATES PATENT AND TRADEMARK OFFICE
CERTIFICATE OF CORRECTION

PATENT NO. : 7,550,827 B2 Page 1 of 1
APPLICATION NO. : 11/576054
DATED : June 23, 2009
INVENTOR(S) : Karlheinz Arndt et al.

It is certified that error appears in the above-identified patent and that said Letters Patent is hereby corrected as shown below:

Title page item [73] "Assignee", delete "Semiconductor" and insert -- Semiconductors --.

Title page item [57] "Abstract", line 1, delete "lot" and insert -- for --.

Title page item [57] "Abstract", line 2, delete "composing" and insert -- comprising --.

Title page item [57] "Abstract", line 5, delete "defining" and insert -- defining a --.

Column 1, line 11, delete "Sep. 23, 2004." and insert -- Sep. 28, 2004. --.

In Claim 4, at column 6, line 29, after "wherein" delete "is".

Signed and Sealed this

Twenty-second Day of September, 2009

David J. Kappos
*Director of the United States Patent and Trademark Office*